(12) United States Patent
Mikhaylich et al.

(10) Patent No.: US 6,431,959 B1
(45) Date of Patent: Aug. 13, 2002

(54) SYSTEM AND METHOD OF DEFECT OPTIMIZATION FOR CHEMICAL MECHANICAL PLANARIZATION OF POLYSILICON

(75) Inventors: Katrina Mikhaylich, San Jose; Michael Ravkin, Sunnyvale, both of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/467,460

(22) Filed: Dec. 20, 1999

(51) Int. Cl.[7] .............................. B24B 1/00; B24B 7/00
(52) U.S. Cl. .......................... 451/41; 451/65; 451/287; 451/307
(58) Field of Search .............................. 451/41, 28, 60, 451/285, 287, 288, 289, 296, 300, 303, 306, 307, 65

(56) References Cited

U.S. PATENT DOCUMENTS

| | | |
|---|---|---|
| 562,437 A | 6/1896 | Tatham et al. |
| 2,606,405 A | 8/1952 | Ohl |
| 3,504,457 A | 4/1970 | Jacobsen et al. |
| 3,615,955 A | 10/1971 | Regh et al. |
| 3,631,634 A | 1/1972 | Weber |
| 3,691,694 A | 9/1972 | Goetz et al. |
| 3,708,921 A | 1/1973 | Cronkhite et al. |
| 3,731,435 A | 5/1973 | Boettcher et al. |
| 3,747,282 A | 7/1973 | Katzke |
| 3,753,269 A | 8/1973 | Budman |
| 3,833,230 A | 9/1974 | Noll |
| 3,857,123 A | 12/1974 | Walsh |
| 3,888,053 A | 6/1975 | White et al. |
| 3,903,653 A | 9/1975 | Imhoff et al. |
| 3,924,361 A | 12/1975 | White et al. |
| 3,986,433 A | 10/1976 | Walsh et al. |
| 4,002,246 A | 1/1977 | Brandt et al. |
| 4,009,539 A | 3/1977 | Day |
| 4,020,600 A | 5/1977 | Day |
| 4,098,031 A | 7/1978 | Hartman et al. |
| 4,104,099 A | 8/1978 | Scherrer |
| 4,132,037 A | 1/1979 | Bonora |
| 4,141,180 A | 2/1979 | Gill, Jr. et al. |
| 4,193,226 A | 3/1980 | Gill, Jr. et al. |
| 4,194,324 A | 3/1980 | Bonora et al. |
| 4,239,567 A | 12/1980 | Winings |
| 4,256,535 A | 3/1981 | Banks |
| 4,270,316 A | 6/1981 | Krämer et al. |
| 4,283,242 A | 8/1981 | Regler et al. |
| 4,316,757 A | 2/1982 | Walsh |
| 4,318,250 A | 3/1982 | Klievoneit et al. |
| 4,373,991 A | 2/1983 | Banks |
| 4,380,412 A | 4/1983 | Walsh |
| 4,450,652 A | 5/1984 | Walsh |
| 4,481,741 A | 11/1984 | Bouladon et al. |
| 4,502,252 A | 3/1985 | Iwabuchi |

(List continued on next page.)

FOREIGN PATENT DOCUMENTS

| | | |
|---|---|---|
| EP | 0 916 452 A2 | 5/1999 |
| RU | 975360 | 11/1982 |
| RU | 1057258 | 11/1983 |

*Primary Examiner*—M. Rachuba
(74) *Attorney, Agent, or Firm*—Brinks Hofer Gilson & Lione

(57) ABSTRACT

A system and method of reducing defects in chemical mechanical planarization of polysilicon is disclosed. The system includes first and second polishing stations each having a different hardness polishing pad and a different slurry. A cleaning station using a dilute SC1 chemistry is also included. The process includes polishing a polysilicon wafer on a first polishing station using a hard polishing pad and then polishing the polysilicon wafer on a second polishing station having a soft pad. The polysilicon wafer may then be directly placed in a scrubber using a dilute SC1 chemistry.

22 Claims, 4 Drawing Sheets

U.S. PATENT DOCUMENTS

| | | |
|---|---|---|
| 4,512,113 A | 4/1985 | Budinger |
| 4,519,168 A | 5/1985 | Cesna |
| 4,593,495 A | 6/1986 | Kawakami et al. |
| 4,607,496 A | 8/1986 | Nagaura |
| 4,680,893 A | 7/1987 | Cronkhite et al. |
| 4,711,610 A | 12/1987 | Riehl |
| 4,720,939 A | 1/1988 | Simpson et al. |
| 4,910,155 A | 3/1990 | Cote et al. |
| 4,918,870 A | 4/1990 | Torbert et al. |
| 4,934,102 A | 6/1990 | Leach et al. |
| 5,081,051 A | 1/1992 | Mattingly et al. |
| 5,081,795 A | 1/1992 | Tanaka et al. |
| 5,095,661 A | 3/1992 | Gill, Jr. et al. |
| 5,148,632 A | 9/1992 | Adler et al. |
| 5,205,082 A | 4/1993 | Shendon et al. |
| 5,257,478 A | 11/1993 | Hyde et al. |
| 5,325,636 A | 7/1994 | Attanasio et al. |
| 5,335,453 A | 8/1994 | Baldy et al. |
| 5,351,360 A | 10/1994 | Suzuki et al. |
| 5,456,627 A | 10/1995 | Jackson et al. |
| 5,484,323 A | 1/1996 | Smith |
| 5,536,202 A | 7/1996 | Appel et al. |
| 5,547,417 A | 8/1996 | Breivogel et al. |
| 5,575,707 A | 11/1996 | Talieh et al. |
| 5,593,344 A | 1/1997 | Weldon et al. |
| 5,611,943 A | 3/1997 | Cadien et al. |
| 5,618,447 A | 4/1997 | Sandhu |
| 5,622,526 A | 4/1997 | Phillips |
| 5,624,501 A | 4/1997 | Gill, Jr. |
| 5,643,044 A | 7/1997 | Lund |
| 5,649,854 A | 7/1997 | Gill, Jr. |
| 5,655,951 A | 8/1997 | Meikle et al. |
| 5,658,183 A | 8/1997 | Sandhu et al. |
| 5,736,463 A * | 4/1998 | Sato .......................... 438/692 |
| 5,858,109 A | 1/1999 | Hymes et al. |
| 5,885,138 A | 3/1999 | Okumura et al. |
| 5,897,426 A * | 4/1999 | Somekh ...................... 451/57 |
| 5,916,012 A | 6/1999 | Pant et al. |
| 6,056,631 A * | 5/2000 | Brown et al. ............... 451/288 |
| 6,135,859 A * | 10/2000 | Tietz ........................... 451/41 |
| 6,139,400 A * | 10/2000 | Sato et al. .................... 451/57 |

\* cited by examiner

SYSTEM AND METHOD OF DEFECT OPTIMIZATION FOR CHEMICAL MECHANICAL PLANARIZATION OF POLYSILICON

BACKGROUND

Semiconductor wafers are typically fabricated with multiple copies of a desired integrated circuit design that will later be separated and made into individual chips. A common technique for forming the circuitry on a semiconductor is photolithography. Part of the photolithography process requires that a special camera focus on the wafer to project an image of the circuit on the wafer. The ability of the camera to focus on the surface of the wafer is often adversely affected by inconsistencies or unevenness in the wafer surface. This sensitivity is accentuated with the current drive toward smaller, more highly integrated circuit designs. Semiconductor wafers are also commonly constructed in layers, where a portion of a circuit is created on a first level and conductive vias are made to connect up to the next level of the circuit. After each layer of the circuit is etched on the wafer, an oxide layer is put down allowing the vias to pass through but covering the rest of the previous circuit level. Each layer of the circuit can create or add unevenness to the wafer that is preferably smoothed out before generating the next circuit layer.

Chemical mechanical planarization (CMP) techniques are used to planarize the raw wafer and each layer of material added thereafter. Available CMP systems, commonly called wafer polishers, often use a rotating wafer holder that brings the wafer into contact with a polishing pad moving in the plane of the wafer surface to be planarized. A polishing fluid, such as a chemical polishing agent or slurry containing microabrasives, is applied to the polishing pad to polish the wafer. The wafer holder then presses the wafer against the rotating polishing pad and is rotated to polish and planarize the wafer.

Chemical mechanical planarization or polishing of polysilicon films is commonly used at different stages in the integrated circuit (IC) manufacturing process. These different stages can be roughly lumped into two categories: (i) smoothing of blanket polysilicon films as an intermediate step to ease further device processing, and (ii) formation of polysilicon filled plugs and trenches for local interconnect, capacitors and isolation needs.

In the case of a blanket film smoothing, some main characteristics of the CMP process are: uniformity of the remaining film, surface roughness of the film, and the final defect level after post-CMP cleaning. For the polysilicon plug or trench formation, some important parameters are polysilicon dishing, oxide erosion, and the quality of both polysilicon and oxide films. In both cases, the surface roughness of the remaining polysilicon film needs to be minimized during the CMP step, and the post-CMP cleaning process should provide low defect level without degrading surface roughness.

Accordingly, a polishing and cleaning process that is capable of providing low surface roughness and a low incidence of surface defects is desirable.

DETAILED DESCRIPTION OF THE PRESENTLY PREFERRED EMBODIMENTS

Figure 1:
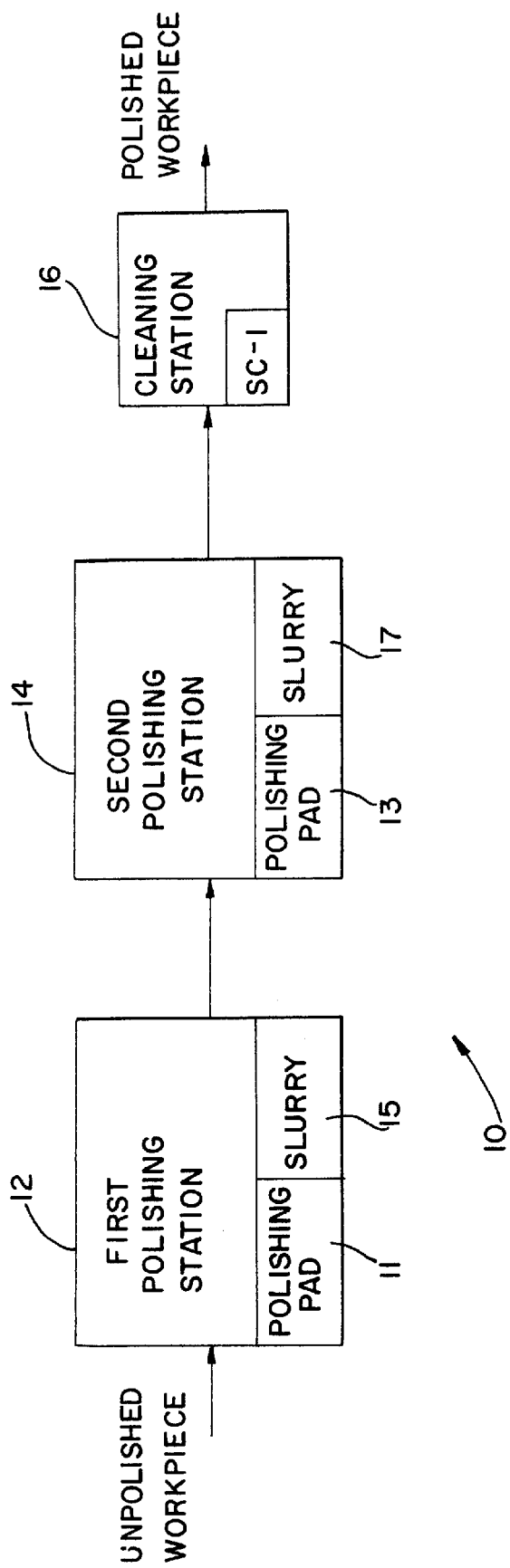
FIG. 1 illustrates a system for minimizing defects in the chemical mechanical planarization of a polysilicon workpiece according to a preferred embodiment.

In order to satisfy the need to reduce defect levels in polysilicon workpieces processed in chemical mechanical polishing or planarization (CMP) systems and to reduce processing time, a system and multi-stage polishing and cleaning process is disclosed below. FIG. 1 illustrates a system 10 for minimizing defects in the chemical mechanical planarization of polysilicon according to a preferred embodiment. The system 10 preferably includes a first polishing station 12, a second polishing station 14 for performing two-stage CMP on a polysilicon workpiece. The system 10 also includes a scrubbing station 16 for post CMP cleaning of the polysilicon workpiece. The polysilicon workpiece may be in the form of a standard wafer on which semiconductor circuits are fabricated. Each of the polishing stations 12, 14 use a polishing pad 11, 13 and a slurry 15, 17 to implement the chemical mechanical planarization or polishing process.

Figure 2:
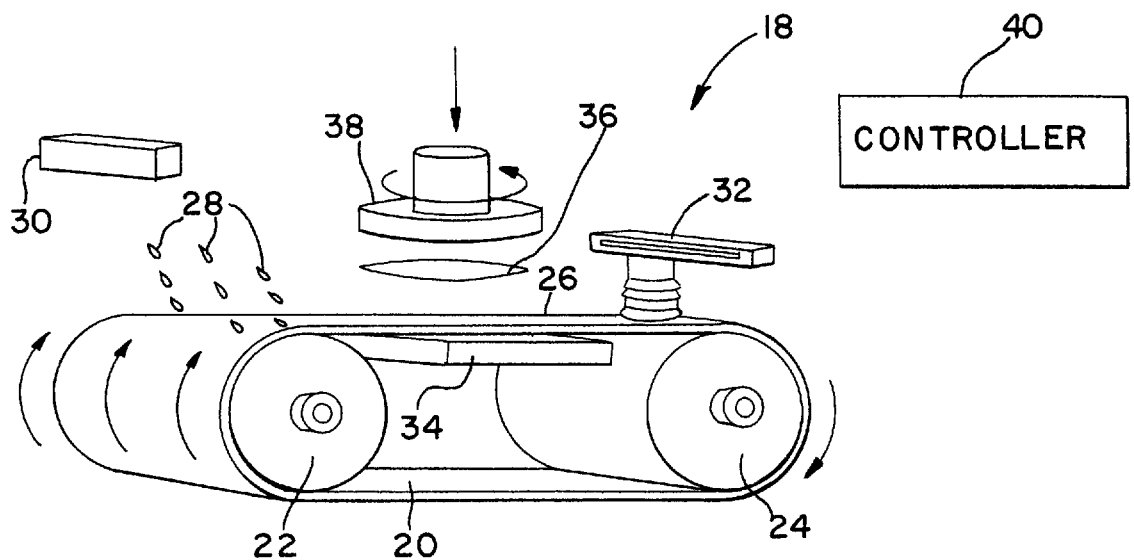
FIG. 2 illustrates a linear polisher for use in the system of FIG. 1.

As shown in FIG. 2, in a preferred embodiment the first polishing station 12 is a linear belt polisher 18. The linear belt polisher 18 includes an endless belt 20 positioned around a first roller 22 and a second roller 24. The belt 20 is preferably constructed from a high tensile strength material, for example a polymer or stainless steel material. A polishing pad 26 covers the belt 20 and cooperates with a polishing fluid such as a chemical agent or slurry 28 containing micro-abrasives to remove material from the surface of a wafer. The linear belt polisher 18 preferably incorporates a slurry dispenser 30 to evenly and continuously maintain a supply of slurry 28 on the polishing pad 26 and a pad conditioner 32 to roughen the pad surface, provide micro-channels for slurry transport and remove debris generated during the CMP process.

A platen 34 is positioned between the rollers 22, 24 and underneath the belt 20 opposite the point where the workpiece, such as a semiconductor wafer 36, is pressed against the polishing pad 26. The platen 34 provides support for the belt during the CMP process. A rotatable wafer holder 38 mounted on a spindle assembly (not shown) is used to bring the wafer 36 against the linearly moving polishing pad 26 and rotate the wafer 36 against the pad 26 during planarization/polishing. A central controller 40 monitors the linear belt polisher and controls operation of the slurry dispenser 30, pad conditioner 32, rollers 22,24, and other aspects of the CMP process. In a preferred embodiment, the linear belt polisher is a TERES™ polisher available from Lam Research Corporation of Fremont, Calif.

Figure 3:
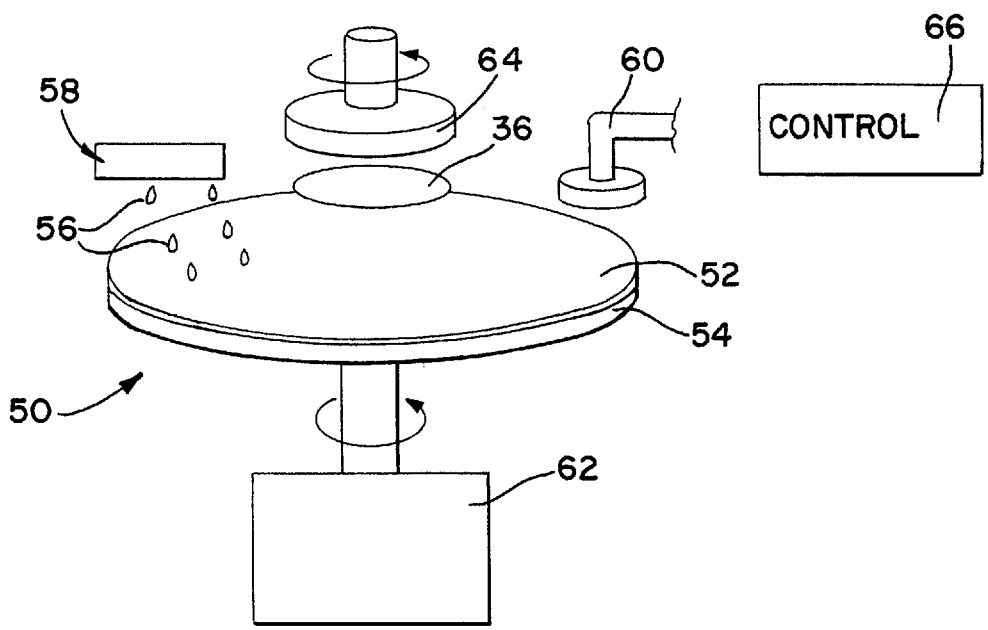
FIG. 3 illustrates a rotary polisher for use in the system of FIG. 1.

A preferred polisher for the second polishing station 16 is a rotary polisher 50, as shown in FIG. 3. The rotary polisher includes a polishing pad 52 mounted on a rotating support member 54. The polishing pad receives a chemical slurry 56 from a slurry dispenser 58 and is conditioned by a pad conditioner 60. The rotating support member is rotatable by a motor 62. The semiconductor wafer 36 is held by a rotatable wafer holder 64 mounted on the end of a spindle (not shown). A controller 66 manages and monitors the operation of the rotary polisher 50. Any of a number of known rotary polishers, such as a Westech 472, may be used.

Referring to FIG. 1, the cleaning station 16 is preferably an OnTrak double-sided scrubber such as a DSS-200 Series II or SYNERGY™ available from Lam Research Corporation in Fremont, Calif. Although the first and second polishing stations are preferably a linear belt polisher and a rotary polisher, respectively, either type of polisher may be used as the first or second polishing station.

Figure 4:
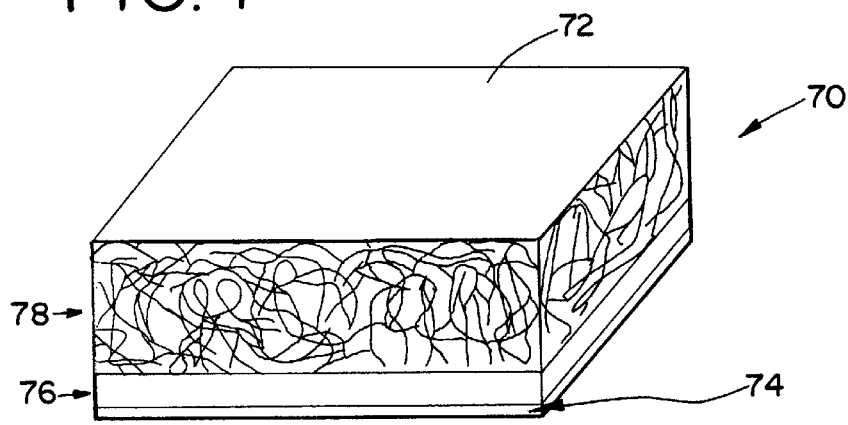
FIG. 4 is a sectional view of a soft polishing pad suitable for use in the system of FIG. 1.
Figure 5:
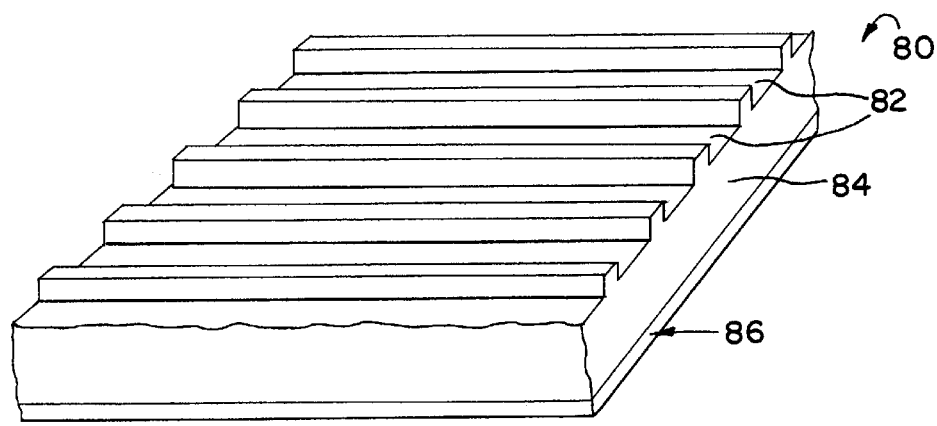
FIG. 5 is a sectional view of a hard polishing pad suitable for use in the system of FIG. 1.

As indicated in FIG. 1, each polishing station 12, 14 preferably utilizes a different type of polishing pad and a different type of slurry. In one embodiment, the polishing pad 11 at the first polishing station 12 is a hard pad and the polishing pad 13 at the second polishing station 14 is a soft pad. One suitable version of a soft pad 70 is shown in FIG. 4. The soft pad 70 may have a non-grooved surface 72 or a grooved surface. The soft pad 70 may include an adhesive layer 74 for attaching the pad to a rotary polisher platen or linear belt, a polyurethane backing layer 76, and a fiber layer composed of a network of fibers 78. A suitable version of a hard pad 80 is shown in FIG. 5. The hard pad 80 may be grooved or non-grooved on its surface. The parallel grooves 82 shown in FIG. 5 may be configured as necessary to aid in the transport of slurry in the CMP process. The hard pad 80 includes an adhesive layer 86 for attaching the pad to a linear belt or rotary polisher platen, as well as a hard layer 84 of, for example, a foam material. For purposes of this specification, the term hard pad is defined as a pad having a compressibility in the range of 0.3–9%, a specific gravity in the range of 0.5–1.5 g/cc and a hardness in the range of 45–75 on the Shore "D" scale. A soft pad is herein defined as a pad having a microporous thickness in the range of 0.01–0.5 mm and a vertical pore height in the range of 0.2–0.8 mm.

Figure 6:
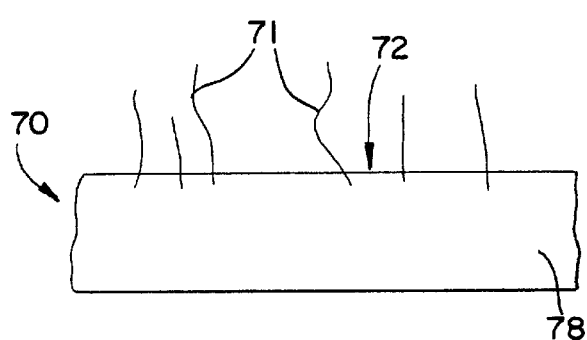
FIG. 6 is a magnified sectional view of the soft polishing pad of FIG. 4.
Figure 7:
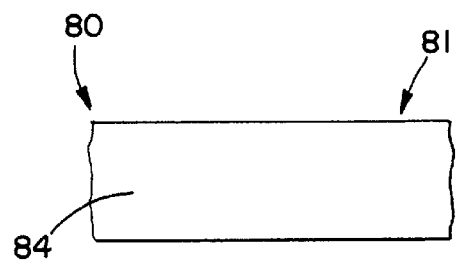
FIG. 7 is a magnified sectional view of a hard polishing pad of FIG. 5.

Additionally, as illustrated in FIGS. 6 and 7, the surface 72 of the soft pad 70 (FIG. 6) differs from the surface 81 of the hard pad 80 (FIG. 5) in that the soft pad 70 is constructed of a material having an irregular network of fibers 71 that extend from the surface 72 of the soft pad 70 and provide a soft layer on the pad 70 that will contact the polysilicon workpiece. In contrast, the hard pad 80 is preferably substantially free of any fibers extending above the surface 81 of the pad 80. The fibers 71 on a particular soft pad may be of different stiffnesses. Different types of soft pads may be fabricated by using a material having fibers of a different average stiffness. A suitable hard pad is the Rodel IC-1000 pad available from Rodel Corporation of Delaware. A suitable soft pad is a "205" pad also available from Rodel Corporation.

Referring again to FIG. 1, the chemical slurries 15, 17 used on each of the polishing stations 12, 14 are preferably different. While both the first slurry 15 and the second slurry may contain colloidal silica particles and have a basic pH, the slurry 15 used at the first polishing station 12 preferably has larger silica particles, and a higher concentration of solids (~50–70 %), than the slurry 17 used at the second polishing station 14. The second slurry 17 preferably has very fine particles and low concentration of solids. Any of a number of slurries with particulate and pH characteristics similar to these described above may be used. One suitable slurry for the first slurry 15 is NALCO 2350 diluted in the range of 18:1 to 22:1 with deionized (DI) water. NALCO 2350 is produced by the NALCO Chemical Company and is available through distributors such as Rodel Corporation of Delaware. A suitable slurry for the second slurry 17 is GLANZOX-3900 diluted in the range of 18:1 to 22:1 with DI water. GLANZOX-3900 is commercially available from Fujimi Corporation of Japan.

Utilizing the system components described above, a preferred method of minimizing defects in a polysilicon workpiece is described below. For the first polishing stage, which is performed at the first polishing station 12, a linear belt polisher 18 (FIG. 2) having a hard pad moving at a speed in the range of 300–600 feet/minute is preferably used. Most preferably, the belt and pad are moving at 400 feet per minute. The workpiece, such as a semiconductor wafer 36, is pressed against the pad at a pressure in the range of 3–8, and most preferably 4, pounds per square inch (p.s.i.). For the second polishing step, which is performed at the second polishing station 14, a rotary polisher 50 (FIG. 3) is preferably used having a soft pad. The rotary polisher may rotate the soft pad at 14–45 revolutions per minute (r.p.m.), preferably 30 r.p.m., and apply a pressure to the wafer in the range of 2–5 p.s.i., and most preferably 3 p.s.i. Any of a number of spindle assemblies configured to hold a workpiece against a polishing pad in a desired pressure range may be used for both the first and second polishing stations. The pressure on the wafer at the first polishing station 12 is preferably higher than the pressure on the wafer at the second polishing station 14. The first slurry used with the hard pad and the second slurry used with the soft pad are both preferably applied at a rate of 100–500 mL/min, and most preferably 200 mL/min.

An advantage of the two step polishing process using hard and soft polishing pads and different slurries as described above is that a wafer buffing step is unnecessary. The wafer buffing step is generally performed on a separate rotating polishing table (buffing station) and is included in wafer polishing to obtain low defect counts in the finished silicon. By using the preferred two step CMP process described above, a separate buffing step is unnecessary.

In addition to the improved CMP process described above, an improved post polysilicon CMP cleaning sequence is contemplated according to a preferred embodiment. After polishing the wafer at both polishing stations 12, 14, the wafer may be cleaned via a post-CMP cleaning process at a cleaning station such as the OnTrak Systems DSS-200 cleaning station. The standard post polysilicon CMP cleaning sequence generally utilizes two different tools: a wet bench for converting a hydrophobic polysilicon surface to hydrophilic with SC-1 (standard clean 1) and possibly SC-2 (standard clean 2) chemistry, and a mechanical brush scrubbing (i.e., buffing) for surface defect reduction. Using the two-stage CMP process described above with reference to FIGS. 1–7, one may avoid the necessity of a wet bench cleaning step by introducing SC-1 chemistry directly into the scrubber. A more detailed description of a suitable cleaning station and process of cleaning a polished wafer is disclosed in U.S. Pat. No. 5,858,109, issued on Jan. 12, 1999, the entire disclosure of which is incorporated by reference. Thus, the wafer may go directly from the second polishing step on the soft pad to the cleaning station 16 (FIG. 1) which may be a mechanical scrubber utilizing SC-1 chemistry.

Standard Clean 1 (SC-1) is a well-known chemical combination that is used to clean bare silicon or a silicon wafer with thermally grown or deposited oxide. SC-1 consists of ammonium hydroxide, peroxide and water. An SC-1 cleaning cycle is designed to promote oxidation and dissolution of organic impurities on the substrates in the SC-1 solution at a temperature of approximately 75° C. to 80° C. For one description of SC-1 chemical cleaning, see W. Kern, "Hydrogen Peroxide Solutions for Silicon Wafer Cleaning," RCA Engineer, vol. 28–343, July/August 1983, pp. 99–105. Standard Clean 2 (SC-2) is another well known chemical combination. SC-2 is a combination of hydrogen peroxide, hydrochloric acid and water.

Figure 8:
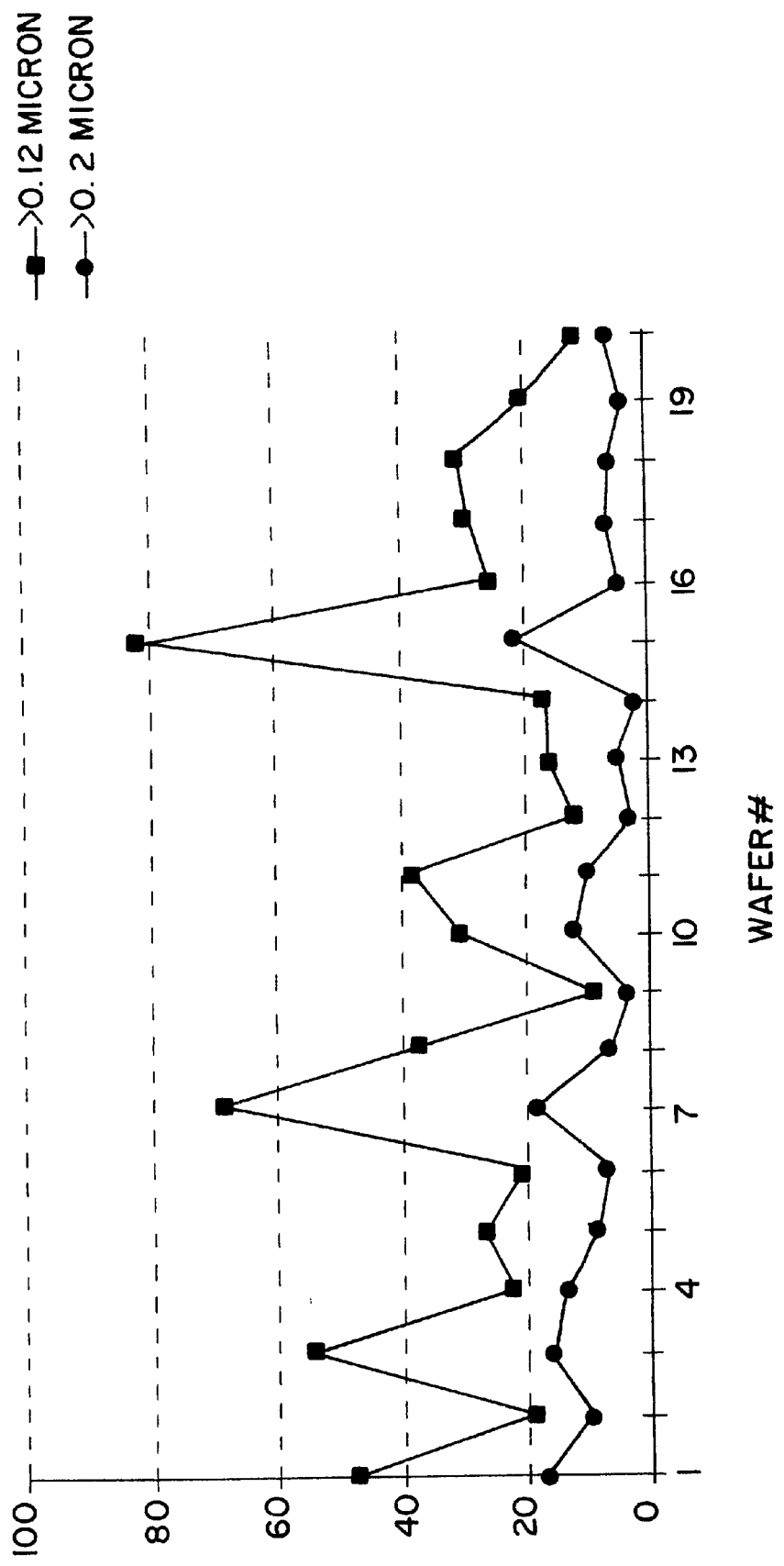
FIG. 8 is a graph illustrating polysilicon wafer defect data for polysilicon wafers polished according to an embodiment of the presently preferred method.

From the foregoing, a multi-stage polishing and cleaning process and a system for implementing this process has been disclosed. In one embodiment, the system includes first and second polishing stations having different hardness polishing pads and different abrasive slurries. A cleaning station combining a mechanical scrubber and SC-1 chemistry may also be used. The process uses this system and includes polishing a polysilicon workpiece on the first polishing station, where the first polishing station is equipped with a hard pad, and then polishing the workpiece on the second polishing station, where the second polishing station has a soft pad. The process minimizes the tool set requirements for the cleaning step by avoiding the need to incorporate the typical wet bench cleaning step by introducing similar chemistry directly into the scrubber. Instead, the process allows the workpiece to be placed directly from the second polishing station into a cleaning station using SC-1 chemistry to produce a smooth and substantially defect free polysilicon surface where the light point defect counts may be comparable to those obtained with the standard multi-tool process, and the surface roughness of the processed workpiece is similar to that of the prime silicon. Utilizing the system and method disclosed herein, defect levels may be achieved as is shown in FIG. 8 which is explained in greater detail in example 3 below.

The foregoing description of the preferred embodiments of the present invention have been presented for purposes of illustration and description. They are not intended to be exhaustive or to limit the invention to the precise forms disclosed, and obviously many other modifications and variations are possible in light of the above teachings. The embodiments were chosen and described to best explain the principles of the invention and its practical applications, thereby enabling others skilled in the art to best utilize the invention in its various embodiments and with various modifications as are suited to the particular use contemplated. It is intended that the scope of the invention be defined by the following claims, including all equivalents.

EXAMPLES

Example 1

Blanket Wafer Polishing

Two types of blanket polysilicon films were investigated: deposited polysilicon and polysilicon re-crystallized from amorphous silicon. Three different slurries were used:
Slurry A=SS-12 (Cabot);
Slurry B=NALCO 2350 (NALCO Chemical Company); and
Slurry C=FGL3900-10 (GLANZOX-3900 from Fujimi).

The polishing conditions and the corresponding roughness values calculated for 5×5 µm area are summarized in Table 1.

TABLE 1

Roughness values for different blanket polysilicon films and polishing conditions.

| Wafer Description | Process First Step | Second Step | Roughness RMS (Å) |
|---|---|---|---|
| As deposited poly | | | 21.32 |
| As deposited poly | Hard Pad, Slurry B, 20 sec | | 6.69 |
| As deposited poly | Hard Pad, Slurry C, 20 sec | | 5.04 |
| As deposited poly | | Soft Pad, Slurry C, 5 min | 1.26 |
| As deposited poly | Soft Pad, Slurry B, 30 sec | Soft Pad, Slurry C, 1 min | 118 |
| Re-crystallized poly | | | 39.24 |
| Re-crystallized poly | Hard Pad, Slurry B, 20 sec | | 20.60 |
| Re-crystallized poly | Hard Pad, Slurry B, 20 sec | | 33.40 |
| Re-crystallized poly | Hard Pad, Slurry B, 20 sec | Soft Pad, Slurry C, 5 min | 4.19 |
| Re-crystallized poly | Soft Pad, Slurry B, 2 min | Soft Pad, Slurry C, 5 min | 3.82 |
| Re-crystallized poly | Hard Pad, Slurry A, 60 sec | | 12.20 |

A significant difference in the surface roughness of these films was observed prior to and following the polishing process. The roughness values for deposited polysilicon film after two step CMP are below 1.5 Å RMS, and are comparable with the roughness of the prime silicon wafers. Re-crystallized polysilicon exhibits much higher roughness for both as deposited and polished films. Only long polishing time (over 2 minutes) on a soft polishing pad reduces surface roughness for less than 5 Å RMS.

Example 2

Patterned Wafer Polishing

The same three slurries that were used for blanket film polishing (EXAMPLE 1 above) were evaluated for patterned wafers with the objective to minimize dishing of the polysilicon lines while maintaining low roughness on both polysilicon and PETEOS surface. Patterned wafers are defined herein as wafers that have had circuitry, which may include sample circuit elements and patterns of a typical circuit, fabricated on them. Slurry A has a low polysilicon to silicon oxide selectivity and slurries B and C have high selectivity. The first step polishing time was determined using temperature based end point system and the second step was timed. Results are summarized in Table 2. One suitable end point system may include an infrared(IR) sensor with a K-type thermocouple output, a digital multimeter with RS-232 interface, a power adapter, and an adjustable mounting bracket. These test system components may be obtained from distributors such as Cole Parmer of Illinois.

TABLE 2

Polysilicon dishing and oxide and polysilicon roughness values on patterned polysilicon wafers for different polishing conditions.

| First Step (over polish after end point (sec)) | Second Step | Polysilicon Dishing (nm) | PETEOS Roughness RMS (Å) | Polysilicon Roughness RMS (Å) |
|---|---|---|---|---|
| Slurry B, Hard Pad, (0) | | 40.3 | 5.90 | 57.2 |
| Slurry B, Hard Pad, (15) | | 55.0 | 6.00 | 62.4 |

TABLE 2-continued

Polysilicon dishing and oxide and polysilicon roughness values on patterned polysilicon wafers for different polishing conditions.

| First Step (over polish after end point (sec)) | Second Step | Polysilicon Dishing (nm) | PETEOS Roughness RMS (Å) | Polysilicon Roughness RMS (Å) |
|---|---|---|---|---|
| Slurry B, Hard Pad, (60) | | 38.0 | 10.8 | 41.0 |
| Slurry B, Hard Pad, (0) | Slurry A, Hard Pad, 30 sec | <2 | 3.7 | 10.7 |
| Slurry B, Hard Pad, (0) | Slurry C, Soft Pad, 5 min | 43.7 | 36.0 | 70.0 |
| Slurry B, Hard Pad, (0) | Modified Slurry C, Soft Pad, 5 min | <4 | 3.5 | 2.6 |

The high selectivity of slurry B makes dishing of the polysilicon lines practically independent from the over polishing time. Unfortunately, it leaves very rough surface of the re-crystallized polysilicon. The second polishing step, utilizing slurry C on a soft pad, which has worked for blanket wafers, did not improve the polysilicon roughness. Using low selectivity slurry A for a second step has significantly reduced dishing and resulted in the low roughness of the oxide, leaving the polysilicon roughness higher than it is desirable. A problem with using low selectivity slurry, however, is the thinning of the whole structure by at least 1000 Å and the thickness variations due to polishing non-uniformity. These problems occur because low selectivity slurry typically removes both polysilicon and silicon dioxide at approximately the same rate and usually does not allow for a precise endpoint. In order to avoid these complications, a modified slurry C was used for the second step polishing. This process results in low dishing, low oxide roughness and the best attainable roughness of the polysilicon line.

Example 3
Post CMP Cleaning

A typical post CMP cleaning sequence would normally use two different tools: a wet bench for converting hydrophobic polished polysilicon surface to hydrophilic with SC-1 and possibly SC-2 chemistry and a mechanical brush scrubbing for surface defect reduction. In a preferred process sequence, introducing similar chemistry directly into the scrubber eliminates the wet bench cleaning step. After polishing, wafers were processed through a DSS-200 scrubber available from Lam Research Corp. using SC-1 or SC-1+SC-2 chemistries supplied directly to the PVA brushes. No additional cleaning steps were used. The process uses 100 ml of SC1 at 1:10:120 dilution ($NH_4OH:H_2O_2:DIW$) and 100 ml of 1:1000 hydrochloric acid (HCl) per wafer. The use of dilute HCl is optional. A preferred SC2 concentration is 1:10:1000.

Light point defects were measured using laser particle counter Tencor 6420 and results demonstrate low defect counts (<20 defects at 0.2 μm). Defect data for a sample group of polysilicon wafers processed using a first polishing step on a hard pad, a second polishing step on a soft pad, and a cleaning as described above are shown in FIG. 6 where the x-axis indicates the different wafers and the y-axis indicates the number of light point defects detected. Metals contamination was measured by TXRF and VPD-ICP-MS/GFAAS methods, and the results are summarized in Tables 3 and 4, respectively. TXRF and VPD-ICP-MS/GFAAS analyses may be performed by, for example, Charles Evans and Associates of Redwood City, Calif.

TABLE 3

Metals level after RCA clean on the DSS-200 by TXRF ($\times 10^{10}$ atoms/cm$^2$).

| Cleaning Conditions | K | Ca | Ti | Cr | Mn | Fe | Ni | Cu | Zn |
|---|---|---|---|---|---|---|---|---|---|
| SC1 only | <20 | 10 | <5 | <3 | <1 | <0.8 | <1 | 40 | 9 |
| SC1 + HC1 | <20 | <8 | <5 | <3 | <1 | <0.8 | <1 | 20 | <3 |

TABLE 4

Metals level after RCA clean on the DSS-200 by VPD-ICP-MS/GFAAS ($\times 10^{10}$ atoms/cm$^2$).

| Cleaning Conditions | Na | Al | Ca | K | Cr | Fe | Ni | Cu | Zn |
|---|---|---|---|---|---|---|---|---|---|
| SC1 only | 5.3 | 11 | 17 | <0.5 | <1 | <0.3 | 0.10 | 29 | 34 |
| SC1 + HC1 | 5.1 | 2.1 | 1.2 | <0.5 | <1 | <0.3 | 0.08 | 9 | 0.7 |
| SC1 + SC2 | 6.7 | 4.7 | <0.5 | <0.5 | <0.1 | <0.3 | <0.05 | 10 | 0.7 |

We claim:
1. A system for minimizing a defect level of a polysilicon workpiece, the system comprising:
a first chemical mechanical planarization polishing station including a first polishing pad having a first polishing surface for receiving the workpiece and a first chemical slurry applied to the first polishing surface, wherein the first chemical slurry comprises a basic solution containing at least a 50 percent concentration of colloidal silica particles that is diluted in the range of 18:1 to 22:1 with deionized water;
a second chemical mechanical planarization polishing station including a second polishing pad having a second polishing surface for receiving the workpiece and a second chemical slurry applied to the second polishing surface; and wherein the first polishing pad has a hardness different than a hardness of the second polishing pad and the first chemical slurry is different from the second chemical slurry.
2. The system of claim 1, wherein the first chemical mechanical planarization polishing station is a linear polishing station and the second chemical mechanical planarization polishing station is a rotary polishing station.
3. The system of claim 1, wherein the first and second chemical mechanical planarization polishing stations are each linear polishing stations.
4. The system of claim 1, wherein the first polishing pad comprises a hard pad and the second polishing pad comprises a soft pad, and wherein the hardness of the first polishing pad is greater than the hardness of the second polishing pad.
5. The system of claim 4, wherein the hardness of the first polishing pad is in the range of 45 to 75 on the Shore "D" scale.
6. The system of claim 1, wherein the second polishing pad comprises a cast polyurethane material having a plurality of fibers extending above the second polishing surface and the first polishing pad comprises a cast polyurethane material having an absence of fibers extending above the first polishing surface.
7. The system of claim 1, wherein the first chemical slurry and the second chemical slurry each comprise a basic solution containing colloidal silica particles, wherein the first chemical slurry contains a higher percentage of colloidal silica particles than the second chemical slurry.
8. The system of claim 1, further comprising a mechanical scrubber configured to receive the workpiece from the second polishing station and clean the workpiece utilizing a standard clean 1 (SC-1) chemistry.

9. A method for minimizing a defect level of a polysilicon workpiece comprising:

providing a first chemical mechanical planarization polishing station including a first polishing pad having a first polishing surface for receiving the workpiece;

moving the first polishing surface relative to the workpiece in a linear direction and applying a first chemical slurry to the first polishing surface, wherein the first chemical slurry comprises a basic solution containing colloidal silica particles;

pressing a surface of the workpiece against the first polishing surface;

providing a second chemical mechanical planarization polishing station including a second polishing pad having a second polishing surface for receiving the workpiece, the second polishing pad having a lower hardness than the first polishing pad;

moving the second polishing surface relative to the workpiece and applying a second chemical slurry to the second polishing surface, the second chemical slurry having a lower concentration of colloidal silica particles than the first chemical slurry; and pressing the surface of the workpiece against the second polishing surface.

10. The method of claim 9, wherein the second chemical mechanical planarization polishing station is a rotary polishing station and moving the second polishing surface further comprises rotating the second polishing surface relative to the surface of the workpiece.

11. The method of claim 9, wherein the first polishing pad is a hard pad and the second polishing pad is a soft pad.

12. The method of claim 9, wherein pressing the surface of the workpiece against the first polishing surface comprises applying a pressure in a range of 3 to 8 pounds per square inch to the workpiece while the first polishing surface moves at a rate in a range of 300 to 600 feet per minute.

13. The method of claim 12, wherein pressing the surface of the workpiece against the second polishing surface comprises applying a pressure in a range of 2 to 5 pounds per square inch to the workpiece while the second polishing surface rotates at a speed in a range of 15 to 45 revolutions per minute.

14. The method of claim 13, wherein applying a first chemical slurry to the first polishing surface comprises applying the first chemical slurry at a rate in a range of 100 to 500 milliliters per minute.

15. The method of claim 9, further comprising receiving and cleaning the workpiece in a chemical mechanical scrubber directly after pressing the workpiece against the second polishing surface, wherein a buffing step is unnecessary between pressing the workpiece against the second polishing surface and receiving and cleaning the workpiece.

16. A method for minimizing a defect level of a polysilicon workpiece comprising:

applying a first chemical slurry to a polishing surface of a first polishing pad moving relative to the workpiece, wherein the first polishing pad is constructed of a material having an absence of fibers extending from the polishing surface;

pressing the workpiece against the first polishing pad for a first time period;

applying a second chemical slurry to a polishing surface of a second polishing pad moving relative to the workpiece, wherein the second polishing pad is constructed of a material having a plurality of fibers extending from the polishing surface and wherein the second chemical slurry has a lower percentage of colloidal silica particles than the first chemical slurry;

pressing the workpiece against the second polishing pad for a second time period; and receiving and cleaning the workpiece in a chemical mechanical scrubber directly after pressing the workpiece against the second polishing pad, wherein a buffing step is avoided between pressing the workpiece against the second polishing pad and receiving and cleaning the workpiece.

17. A system for minimizing a defect level of a polysilicon workpiece, the system comprising:

a first chemical mechanical planarization polishing station including a first polishing pad having a first polishing surface for receiving the workpiece, the first polishing pad having an absence of fibers extending above the first polishing surface and a first chemical slurry applied to the first polishing surface;

a second chemical mechanical planarization polishing station including a second polishing pad having a second polishing surface for receiving the workpiece, the second polishing pad having a plurality of fibers extending above the second polishing surface and a second chemical slurry applied to the second polishing surface; and wherein the first polishing pad has a hardness different than a hardness of the second polishing pad and the first chemical slurry is different from the second chemical slurry.

18. The system of claim 17, wherein the first chemical mechanical planarization polishing station is a linear polishing station and the second chemical mechanical planarization polishing station is a rotary polishing station.

19. The system of claim 17, wherein the first and second chemical mechanical planarization polishing stations are each linear polishing stations.

20. The system of claim 17, wherein the first polishing pad comprises a hard pad and the second polishing pad comprises a soft pad, and wherein the hardness of the first polishing pad is greater than the hardness of the second polishing pad.

21. The system of claim 20, wherein the hardness of the first polishing pad is in the range of 45 to 75 on the Shore "D" scale.

22. The system of claim 17, wherein the first chemical slurry and the second chemical slurry each comprise a basic solution containing colloidal silica particles, wherein the first chemical slurry contains a higher percentage of colloidal silica particles than the second chemical slurry.

* * * * *